(12) United States Patent
Inoue et al.

(10) Patent No.: US 8,237,222 B2
(45) Date of Patent: Aug. 7, 2012

(54) SEMICONDUCTOR DEVICE AND METHOD OF MANUFACTURING THE SAME

(75) Inventors: Ayako Inoue, Chiba (JP); Naoto Saitoh, Chiba (JP)

(73) Assignee: Seiko Instruments Inc. (JP)

( * ) Notice: Subject to any disclaimer, the term of this patent is extended or adjusted under 35 U.S.C. 154(b) by 338 days.

(21) Appl. No.: 12/658,825

(22) Filed: Feb. 16, 2010

(65) Prior Publication Data

US 2010/0219472 A1    Sep. 2, 2010

(30) Foreign Application Priority Data

Feb. 23, 2009  (JP) ................................. 2009-039344

(51) Int. Cl.
*H01L 29/78* (2006.01)
*H01L 21/336* (2006.01)

(52) U.S. Cl. ...................................................... 257/335

(58) Field of Classification Search .......... 257/135–136, 257/E27.091, E27.095–E27.096, E29.118, 257/E29.274, E29.313, E29.318, E29.262, 257/E21.41, E21.629, E21.643, 213–413, 257/900, 902–903, E21.19–E21.21, E21.394–E21.458, 257/E21.615–E21.694, E21.417, E29.261; 438/135, 142, 287, 288, 289, 290, 291, 297, 438/223, 224, 203, 305, 199, 227, 228, 217, 438/261, 216

See application file for complete search history.

(56) References Cited

U.S. PATENT DOCUMENTS

| | | | | |
|---|---|---|---|---|
| 5,811,850 A | * | 9/1998 | Smayling et al. | 257/335 |
| 6,306,700 B1 | * | 10/2001 | Yang | 438/217 |
| 7,214,591 B2 | * | 5/2007 | Hsu | 438/298 |
| 2009/0273028 A1 | * | 11/2009 | Mallikarjunaswamy et al. | 257/335 |

OTHER PUBLICATIONS

Patent Abstracts of Japan, publication No. 2008-166717, publication date Jul. 17, 2008.

* cited by examiner

*Primary Examiner* — Dao H Nguyen
*Assistant Examiner* — Tram H Nguyen
(74) *Attorney, Agent, or Firm* — Adams & Wilks

(57) ABSTRACT

In a method of manufacturing a high withstanding voltage MOSFET, a region to be doped with impurities and a region to be doped with no impurity are provided when ion implantation of the impurities is performed in the channel forming region, for controlling a threshold voltage. The region to be doped with no impurity is suitably patterned so that impurity concentration of the channel forming region near boundaries between a well region and a source region and between the well region and a drain region having the same conductivity type as the well region may be increased, to thereby induce a reverse short channel effect. By canceling a short channel effect with the reverse short channel effect induced by the above-mentioned method, the short channel effect of the high withstanding voltage MOSFET may be suppressed.

6 Claims, 6 Drawing Sheets

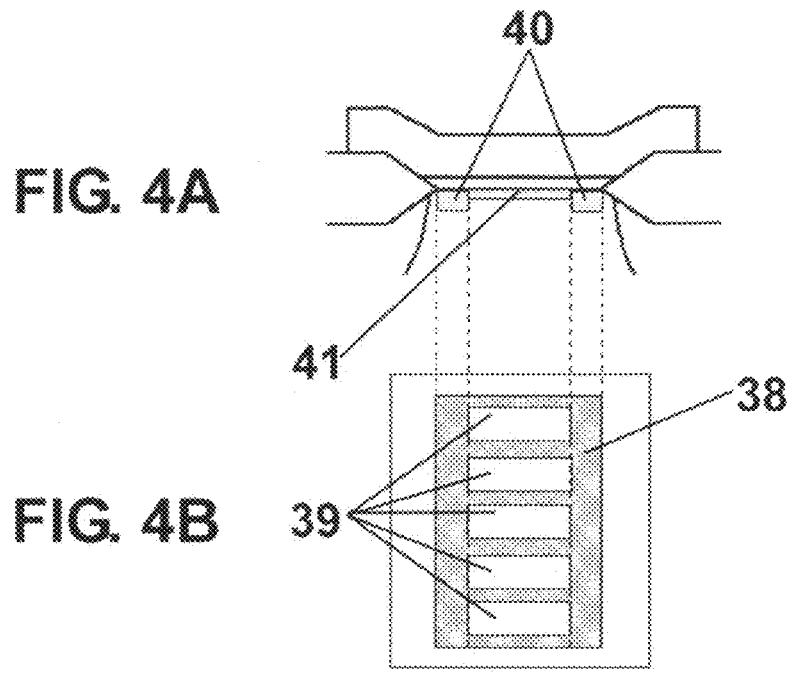
FIG. 4A
FIG. 4B
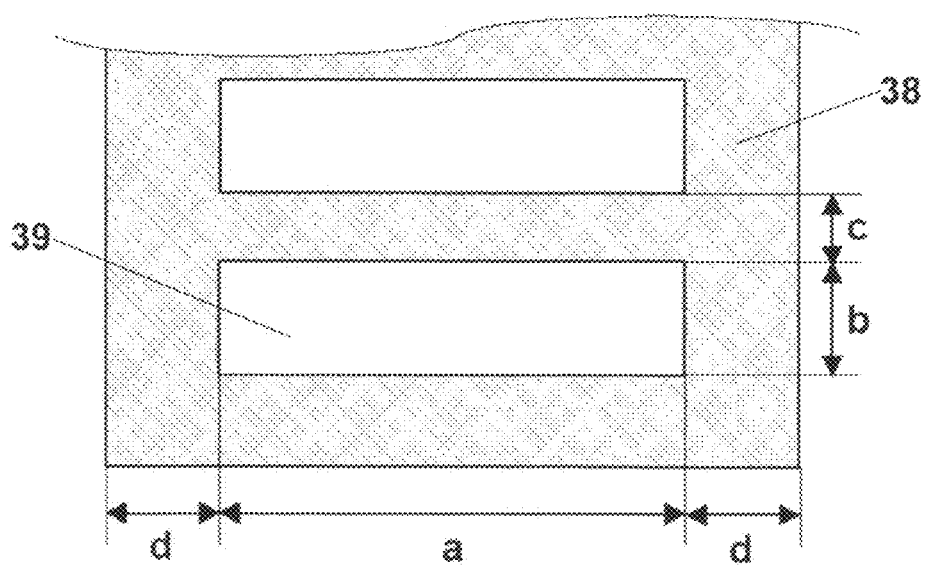
FIG. 5

Prior Art

SEMICONDUCTOR DEVICE AND METHOD OF MANUFACTURING THE SAME

BACKGROUND OF THE INVENTION

1. Field of the Invention

The present invention relates to a semiconductor device including a high withstanding voltage metal oxide semiconductor field effect transistor (MOSFET) and a method of manufacturing the same.

2. Description of the Related Art

Conventionally, various efforts have been made so as to attain high withstanding voltage of a MOSFET. As one example of the efforts, there has been proposed a method of diffusing low concentration impurities in a region adjacent to a drain region or in a part of the drain region, so as to reduce an electric field concentration occurring near a surface of the drain region, which is a one of the factors of withstanding voltage deterioration.

A typical structure of the above-mentioned high withstanding voltage MOSFET is described based on an example of an n-channel type MOSFET using a p-type substrate, with reference to a cross-sectional view illustrated in FIG. 6. A p-type well 2 is formed along a main surface of a p-type semiconductor substrate 1. The p-type well region 2 is doped with low concentration n-type impurities so that a low concentration source region 3 and a low concentration drain region 4 are formed therein. Further, the low concentration source region 3 and the low concentration drain region 4 are doped with high concentration n-type impurities so that a high concentration source region 5 and a high concentration drain region 6 are formed therein, respectively. Above a surface of the substrate on which the low concentration source region 3 and the low concentration drain region 4 described above are formed, a gate electrode 9 is formed through a gate oxide film 7 and a field insulating film 8. In this manner, the MOSFET is formed. In the MOSFET with such a structure, a field concentration occurring near the surface of the drain region when a drain voltage is applied can be alleviated by depletion of the low concentration source region 3 and the low concentration drain region 4, which are formed by diffusing the low concentration n-type impurities. Thus, the high withstanding voltage is attained. However, the low impurity concentrations of the low concentration source region 3 and the low concentration drain region 4 induce reduction in impurity concentrations of the low concentration source region 3 and the low concentration drain region 4 in boundary portions with the adjacent p-type well region 2, with the result that a depletion layer is excessively widened, and hence there is a problem that a short channel effect is increased.

In view of the above-mentioned problem, a trench gate type high withstanding voltage MOSFET in which the short channel effect is suppressed is proposed (for example, see JP 2008-166717 A).

A structure of the above-mentioned trench gate type high withstanding voltage MOSFET is described based on an example of an n-channel type MOSFET using a p-type substrate, with reference to a cross-sectional view illustrated in FIG. 7. A p-type well region 10 is formed on a p-type semiconductor substrate (not shown). The p-type well region 10 is doped with n-type impurities so that a drift region 11 is formed therein. Further, on the drift region 11 described above, a source region 12 and a drain region 13 are formed so as to extend onto element isolation regions 14 by diffusing n-type impurities higher in concentration than that of the drift region 11. A groove-like trench is formed between the source region 12 and the drain region 13, and above the groove-like trench, a gate electrode 17 is formed through a gate oxide film 15 and a cap oxide film 16. In this manner, the trench gate type high withstanding voltage MOSFET is formed. Since a channel region is formed under a trench portion in the trench gate type high withstanding voltage MOSFET according to JP 2008-166717 A, the drift layer does not extend in a channel direction due to diffusion, to thereby suppress the short channel effect.

However, the process flow becomes complicated and the number of steps increases compared to a manufacturing method for a conventional high withstanding voltage MOSFET, and hence there is a disadvantage in view of cost and manufacturing time since a groove-like trench needs to be formed between the source region and the drain region in the trench gate type high withstanding voltage MOSFET according to JP 2008-166717 A.

SUMMARY OF THE INVENTION

It is an object of the present invention to provide a method of manufacturing a high withstanding voltage metal oxide semiconductor field effect transistor (MOSFET) in which a short channel effect is suppressed, which is capable of maintaining cost and manufacturing time of the conventional high withstanding voltage MOSFET without making complex a process flow and increasing the number of steps of a conventional high withstanding voltage MOSFET.

According to the present invention, in order to achieve the above-mentioned object, the following method is employed. In a channel forming region, a region to be doped with impurities and a region to be doped with no impurity are provided when ion implantation of the impurities is performed in the channel forming region, for controlling a threshold voltage. The region to be doped with no impurity is suitably patterned so that impurity concentration of the channel forming region near boundaries between a well region and a low concentration source region and between the well region and a low concentration drain region, which has the same conductivity type as that of the well region, may be increased, to thereby induce a reverse short channel effect. By canceling the short channel effect with the reverse short channel effect induced by the above-mentioned method, the short channel effect of the high withstanding voltage MOSFET may be suppressed.

According to the present invention, the region to be doped with the impurities and the region to be doped with no impurity are suitably patterned when impurity ions are implanted into the channel forming region, for controlling the threshold voltage. As a result, without making complex the process flow and increasing the number of steps, the short channel effect of the high withstanding voltage MOSFET may be suppressed.

BRIEF DESCRIPTION OF THE DRAWINGS

In the accompanying drawings:

FIGS. 4A and 4B are a schematic cross-sectional view and a schematic plan view, respectively, each illustrating a channel doping process of the manufacturing method according to the present invention;

FIG. 5 is a schematic plan view illustrating a patterning size in the channel doping process of the manufacturing method according to the present invention;

DETAILED DESCRIPTION OF THE PREFERRED EMBODIMENT

Hereinafter, an embodiment according to the present invention is described in detail.

Figure 1:
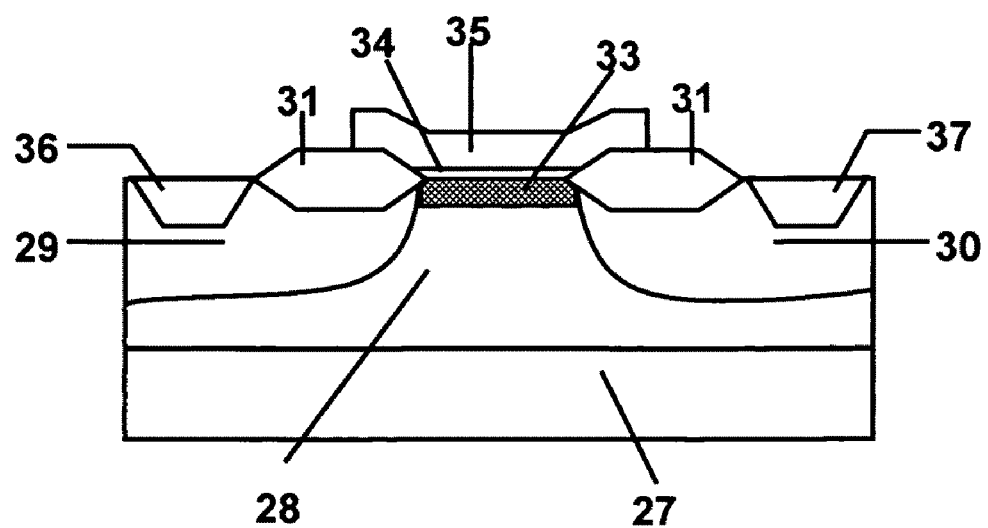
FIG. 1 is a cross-sectional view illustrating an element structure of a high withstanding voltage MOSFET according to the present invention.

FIG. 1 is a cross-sectional view illustrating an element structure of a high withstanding voltage metal oxide semiconductor field effect transistor (MOSFET) according to the present invention. A well region 28 of a first conductivity type is formed along a main surface of a semiconductor substrate 27. The well region 28 is doped with low concentration impurities of a second conductivity type so that a low concentration source region 29 and a low concentration drain region 30 are formed as being spaced apart from each other. Further, the low concentration source region 29 and the low concentration drain region 30 are doped with high concentration impurities of a second conductivity type so that a high concentration source region 36 and a high concentration drain region 37 are formed therein, respectively.

A first and second field insulating films 31 are formed so as to be spaced apart from each other between the high concentration source region 36 and the high concentration drain region 37. Further, the first field insulating film 31 contacts with the high concentration source region 36 in the low concentration source region 29, and the second field insulating film 31 contacts with the high concentration drain region 37 in the low concentration drain region 30. Above a surface of the semiconductor substrate between the first and second field insulating films 31, a channel forming region 33 is formed. The impurity concentration of the first conductivity type of the channel forming region 33 is non-uniform in a lateral direction, that is, the channel forming region 33 is high in impurity concentration of the first conductivity type near boundaries at which the channel forming region 33 contacts with the low concentration source region 29 and the low concentration drain region 30, while the channel forming region 33 is relatively low in impurity concentration of the first conductivity type in a portion away from the boundaries at which the channel forming region 33 contacts with the low concentration source region 29 and the low concentration drain region 30.

Further, on the channel forming region 33, a gate oxide film 34 is formed between the first and second field insulating films 31. A gate electrode 35 is formed on the gate oxide film 34, and the gate electrode 35 is formed so as to extend onto the first and second field insulating films 31. It should be noted that, when the first conductivity type defined as a p-type semiconductor, the second conductivity type is an n-type semiconductor. Alternatively, when the first conductivity type defined as the n-type semiconductor, the second conductivity type is the p-type semiconductor. The high withstanding voltage MOSFET according to the present invention has a configuration as described above.

Hereinafter, a method of manufacturing the high withstanding voltage MOSFET according to the present invention is described with reference to the sectional views and the plan views illustrated in FIGS. 2 to 5. In this embodiment, for ease of description, the description is made assuming that an n-channel type MOSFET using a p-type substrate is described. However, by changing the type of the impurities to be used, a p-channel type MOSFET may also be described in the same manner.

Figure 2A:
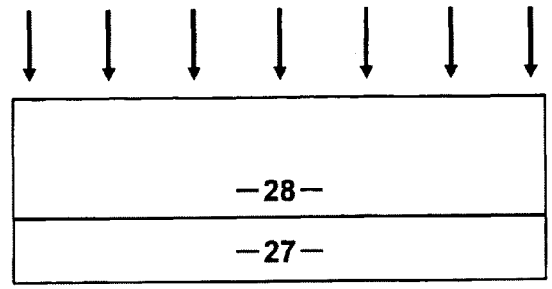
FIGS. 2A to 2D are process cross-sectional views for schematically illustrating process steps of a manufacturing method for the high withstanding voltage MOSFET according to the present invention.

First, as illustrated in FIG. 2A, p-type impurities are introduced into a p-type semiconductor substrate 27 by ion implantation at a dose amount of $5 \times 10^{12}$ to $1 \times 10^{13}$ atoms/cm$^2$ through a sacrificial oxide film (not shown) of approximately 500 Å, and then the substrate is subjected to heat treatment. Thus, a p-type well region 28 is formed.

Figure 2B:
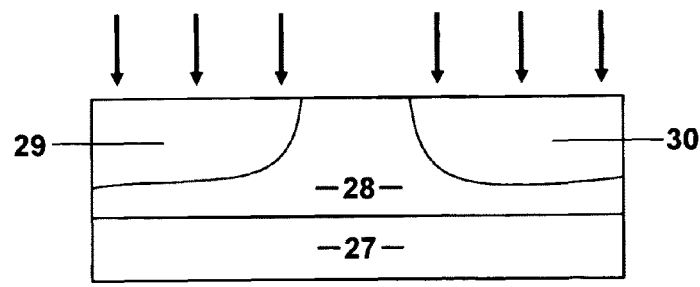

Next, as illustrated in FIG. 2B, n-type impurities are introduced into the p-type well region 28 by ion implantation at a dose amount of $2 \times 10^{12}$ to $6 \times 10^{12}$ atoms/cm$^2$ through a sacrificial oxide film (not shown) of approximately 500 Å, and then the substrate is subjected to heat treatment, to thereby form the low concentration source region 29 and the low concentration drain region 30 which are spaced apart from each other.

Figure 2C:
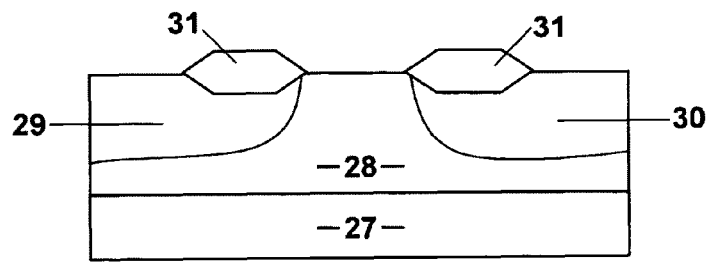

Next, as illustrated in FIG. 2C, by using device isolation technology, the field insulating films 31 are formed in the low concentration source region 29 and the low concentration drain region 30, respectively. At this time, the first field insulating film 31 is formed so that the end portions thereof are substantially at the same position as the end portions of the low concentration source region 29. Similarly, the second field insulating film 31 is formed so that the end portions thereof are substantially at the same position as the end portions of the low concentration drain region 30.

Figure 2D:
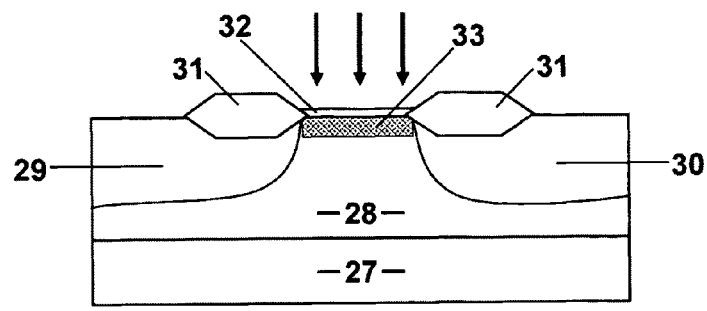

Next, as illustrated in FIG. 2D, p-type impurities for controlling threshold voltage are introduced into the channel forming region 33 at a dose amount in a range between $1 \times 10^{11}$ to $1 \times 10^{13}$ atoms/cm$^2$ through an oxide film 32. Hereinafter, this ion implantation process is referred to as "channel doping".

FIGS. 4A and 4B illustrate a schematic cross-sectional view and a schematic plan view, respectively, of the above-mentioned channel doping process. As illustrated in FIG. 4B, regions 39 to be doped with no impurity are formed by patterning rectangular regions in part of a region 38 to be doped with the impurities at the time of channel doping. The region 38 to be doped with the impurities is provided at the end portions of the channel forming region 33, which are near boundaries between the channel forming region 33 and the field insulating films located at both sides thereof. Further, in part of the channel forming region 33 which is away from the field insulating films 31, the rectangular regions 39 to be doped with no impurity and the region 38 to be doped with the impurities are formed alternately in a channel width direction, to thereby form a grid-like pattern. As described above, the channel forming region 33 to be doped, in a peripheral portion thereof, with impurities having different conductivity type with that of the source and drain regions, and the channel forming region 33 has a mask, in a non-peripheral portion thereof, the mask being patterned so as to alternately form the regions 39 to be doped with no impurity and the region 38 to be doped with the impurities, and then the channel doping is performed.

FIG. 5 is a view for illustrating the patterning size. In this embodiment, the size of the regions 39 to be doped with no impurity is set as follows. A length a in the channel length direction is approximately 0.1 to 4.0 µm and a length b in the channel width direction is approximately 0.1 to 2.0 µm. Interval c between the regions 39 to be doped with no impurity is approximately 0.1 to 2.0 µm. Further, distances d corresponding to the distances from the boundary between the channel forming region and the source region and the boundary between the channel forming region and the drain region, to the end portions of the region to be doped with no impurity, respectively, are approximately 0.1 to 4.0 µm.

The impurities introduced by the channel doping are also diffused into the regions 39 to be doped with no impurity by heat treatment to be performed later, and a region 41 having uniform low impurity concentration is formed at the non-peripheral portion of the channel forming region 33. On the other hand, a region 40 having higher impurity concentration than that of the region 41 is formed at the peripheral portion of the channel forming region 33 (see FIG. 4A).

According to the method as described above, the region 40 having high impurity concentration and the region 41 having low impurity concentration are simultaneously formed in one channel forming region, which is a feature of the present invention.

Figure 8A:
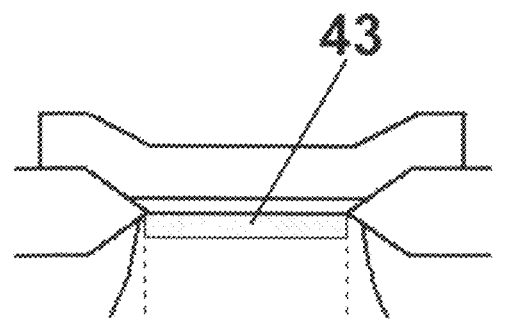
FIGS. 8A and 8B are a schematic cross-sectional view and a schematic plan view, respectively, each illustrating a channel doping process of the manufacturing method for the conventional high withstanding voltage MOSFET.
Figure 8B:
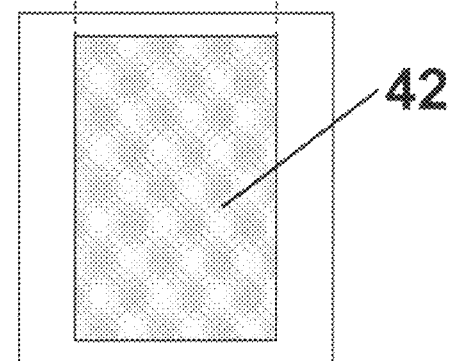

As illustrated in FIG. 8, in the conventional channel doping, impurities are introduced uniformly into an entire surface of a region 42 to be doped with the impurities, and hence a channel forming region 43 has a uniform impurity concentration distribution. In contrast, according to this embodiment, since the regions 39 to be doped with no impurity are formed in part of the region 38 to be doped with the impurities, to thereby form the region 40 having high impurity concentration in the channel forming region near the boundaries between the channel forming region and the source region and between the channel forming region and the drain region, a reverse short channel effect can be induced. As a result, a short channel effect, which has been a problem of the high withstanding voltage MOSFET, is canceled with the reverse short channel effect, to thereby suppress the short channel effect of the high withstanding voltage MOSFET. Further, the area and the density of the regions 39 to be doped with no impurity are adjusted, to thereby allow adjustments to be freely made to the threshold voltage and the reverse short channel effect to be induced.

In this embodiment, p-type impurities are used in the channel doping. However, both n-type impurities and p-type impurities may be selectively used as the situation demands. When n-type impurities, having the same type as that of the low concentration source region 29 and the low concentration drain region 30, are used in the channel doping, the region 38 to be doped with the impurities and the regions 39 to be doped with no impurity may be patterned using a mask with a reversed pattern with respect to the example described above, and then the channel doping may be performed. That is, mask patterning is performed such that the n-type impurities are not introduced into a portion corresponding to the frame of the grid, while the n-type impurities may be introduced into portions corresponding to windows of the grid. By performing the channel doping through this mask, similar effects as those described above may be achieved.

Figure 3A:
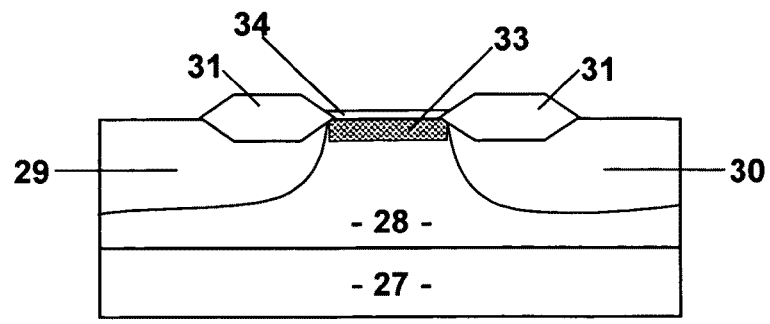
FIGS. 3A to 3C are process cross-sectional views for schematically illustrating process steps subsequent to the process steps illustrated in FIG. 2, of the manufacturing method for the high withstanding voltage MOSFET according to the present invention.
Figure 3B:
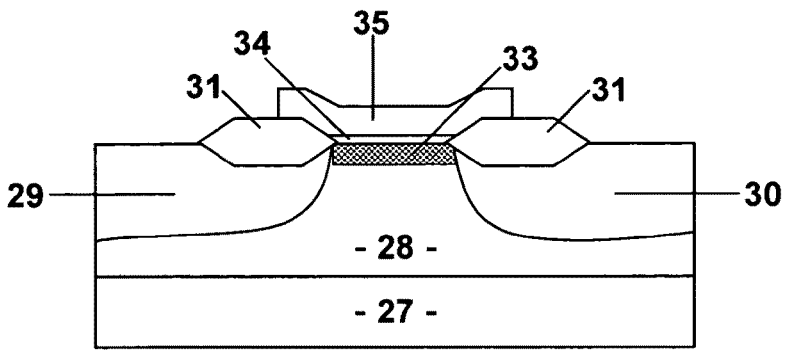

After the channel doping is completed, as illustrated in FIG. 3A, the gate oxide film 34 of approximately 400 Å is formed by thermal oxidation. Then, as illustrated in FIG. 3B, a polysilicon film (not shown) of approximately 2,800 Å is deposited onto the entire surface of the substrate by chemical vapor deposition (CVD). Then, the n-type impurities at a dose amount in a range between $1 \times 10^{15}$ to $1 \times 10^{16}$ atoms/cm$^2$ are ion implanted, heat treatment is performed, and further etching is performed. In this manner, the gate electrode 35 is formed.

Figure 3C:
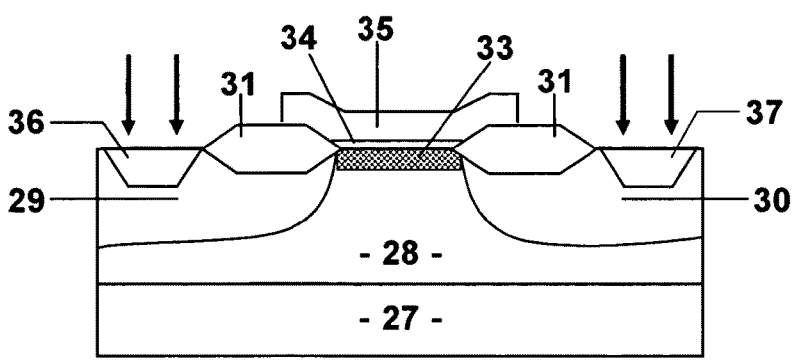
Figure 6:
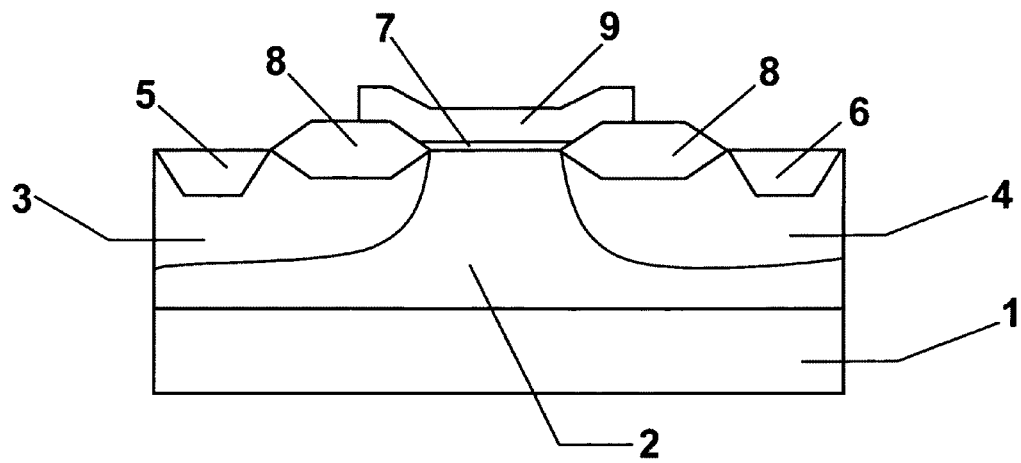
FIG. 6 is a cross-sectional view illustrating an example of an element structure of a conventional high withstanding voltage MOSFET.
Figure 7:
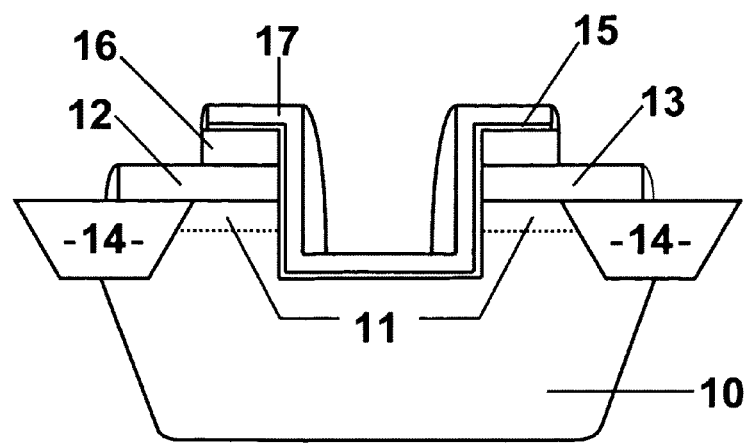
FIG. 7 is a cross-sectional view illustrating an element structure of a conventional trench gate type MOSFET.

Next, as illustrated in FIG. 3C, in the low concentration source region 29 and the low concentration drain region 30, the n-type impurities at a dose amount of $3 \times 10^{15}$ to $5 \times 10^{15}$ atoms/cm$^2$ are ion implanted and heat treatment is performed, to thereby form the high concentration source region 36 and the high concentration drain region 37. Processes to be carried out after forming the high concentration source region 36 and the high concentration drain region 37, including a process of forming electrode wirings (forming process of metal wiring and protection film), are the same as those of a general method of manufacturing a semiconductor device, and hence detailed description thereof is omitted. In the above, the manufacturing method according to this embodiment has been described.

In this embodiment, an n-channel transistor using a p-type substrate is described as an example. However, p-channel transistors may be described in a similar way.

As described above, when the impurities are to be ion implanted in the channel forming region, the region to be doped with the impurities and the region to be doped with no impurity are patterned as a mask and then subjected to channel doping, to thereby suppress the short channel effect in the high withstanding voltage MOSFET without making complex the process flow and increasing the number of steps.

What is claimed is:

1. A method of manufacturing a semiconductor device, comprising:
    forming a well region of a first conductivity type on a semiconductor substrate;
    forming a low concentration source region of a second conductivity type and a low concentration drain region of the second conductivity type in the well region, the low concentration source region and the low concentration drain region being spaced apart from each other;
    forming a high concentration source region of the second conductivity type in the low concentration source region;
    forming a high concentration drain region of the second conductivity type in the low concentration drain region;
    forming a first field oxide film in the low concentration source region;
    forming a second field oxide film in the low concentration drain region; and
    providing a region to be doped with impurities for threshold voltage adjustment and a region to be doped with no impurity in a channel forming region located between the low concentration source region and the low concentration drain region, and performing channel doping therein.

2. A method of manufacturing a semiconductor device according to claim 1, wherein:
    the region to be doped with the impurities for threshold voltage adjustment and the region to be doped with no impurity are formed in a grid-like pattern including a rectangular window; and
    the region to be doped with no impurity corresponds to a portion corresponding to the rectangular window of the grid when the region to be doped with the impurities corresponds to a portion corresponding to a frame of the grid, and the region to be doped with the impurities corresponds to the portion corresponding to the rectangular window of the grid when the region to be doped with no impurity corresponds to the portion corresponding to the frame of the grid.

3. A method of manufacturing a semiconductor device according to claim 2, wherein, when the impurities for threshold voltage adjustment are of the first conductivity type, the portion corresponding to the frame of the grid is doped with the impurities.

4. A method of manufacturing a semiconductor device according to claim 2, wherein, when the impurities for threshold voltage adjustment are of the second conductivity type, the portion corresponding to the rectangular window of the grid is doped with the impurities.

5. A semiconductor device, comprising:
- a well region of a first conductivity type formed along a main surface of a semiconductor substrate;
- a low concentration source region of a second conductivity type and a low concentration drain region of the second conductivity type, which are formed in the well region and spaced apart from each other;
- a high concentration source region of the second conductivity type formed in the low concentration source region;
- a high concentration drain region of the second conductivity type formed in the low concentration drain region;
- a first field oxide film formed in the low concentration source region, the first field oxide film having one end portion in contact with the high concentration source region;
- a second field oxide film formed in the low concentration drain region, the second field oxide film having one end portion in contact with the high concentration drain region;
- a channel forming region located between the low concentration source region and the low concentration drain region; and
- a gate electrode formed above the channel forming region through a gate oxide film,
- wherein the channel forming region comprises a region doped with first conductivity type impurities at a first impurity concentration at a peripheral portion near boundaries between the low concentration source region and the channel forming region and between the low concentration drain region and the channel forming region, and a region doped with the first conductivity type impurities at a second impurity concentration at a non-peripheral portion.

6. A semiconductor device according to claim 5, wherein the first impurity concentration of the first conductivity type impurities for threshold voltage adjustment is higher than the second impurity concentration.

* * * * *